United States Patent
Frank et al.

(10) Patent No.: US 7,223,677 B2
(45) Date of Patent: May 29, 2007

(54) PROCESS FOR FABRICATING A SEMICONDUCTOR DEVICE HAVING AN INSULATING LAYER FORMED OVER A SEMICONDUCTOR SUBSTRATE

(75) Inventors: Martin Michael Frank, Summit, NJ (US); Yves Chabal, Holmdel, NJ (US); Glen David Wilk, New Providence, NJ (US); Martin L. Green, Summit, NJ (US)

(73) Assignee: Agere Systems, Inc., Allentown, PA (US)

( * ) Notice: Subject to any disclaimer, the term of this patent is extended or adjusted under 35 U.S.C. 154(b) by 202 days.

(21) Appl. No.: 10/876,183

(22) Filed: Jun. 24, 2004

(65) Prior Publication Data

US 2004/0235313 A1    Nov. 25, 2004

Related U.S. Application Data

(62) Division of application No. 10/306,565, filed on Nov. 27, 2002, now abandoned.

(51) Int. Cl.
*H01L 21/20*    (2006.01)
(52) U.S. Cl. ..................................... 438/584
(58) Field of Classification Search ............... 438/149, 438/584; 428/205, 209
See application file for complete search history.

(56) References Cited

U.S. PATENT DOCUMENTS

| | | | |
|---|---|---|---|
| 6,200,893 B1 | 3/2001 | Sneh | |
| 6,203,613 B1 | 3/2001 | Gates et al. | |
| 6,613,695 B2 | 9/2003 | Pomarede et al. | |
| 2002/0098627 A1 | 7/2002 | Pomarede et al. | |
| 2002/0127867 A1 | 9/2002 | Lee | |
| 2002/0182385 A1* | 12/2002 | Senkevich et al. | 428/209 |
| 2003/0003635 A1* | 1/2003 | Paranjpe et al. | 438/149 |

OTHER PUBLICATIONS

G.D. Wilk, R. M. Wallace, J.M. Anthony; "High-K Gate Dielectrics: Current Status and Materials Properties Considerations"; Journal of Applied Physics, vol. 89, No. 10, May 15, 2001; pp. 5243-5275.
Wolf, et al.; "Silicon Processing for the VLSI Era"; vol. 2 Process Integration, Lattice Press; Sunset Beach, CA 1990, pp. 298-299.
Parent case U.S. Appl. No. 10/306,565, filed Nov. 27, 2002; entitled "A Process for Fabricating a Semiconductor Device Having an Insulating Layer Formed Over a Semiconductor Substrate" to Yves Chabal, et al. currently pending.

* cited by examiner

*Primary Examiner*—Carl Whitehead, Jr.
*Assistant Examiner*—Monica D. Harrison

(57) ABSTRACT

The present invention provides a method for manufacturing a semiconductor device comprising an insulating layer that includes a seed layer formed on a silicon substrate. The seed layer is formed by exposing a hydrogen-terminated surface of the silicon substrate in a substantially oxygen-free environment to a seed layer precursor comprising a methylated metal. Forming the insulating layer further includes depositing a dielectric material on the seed layer.

17 Claims, 6 Drawing Sheets

PROCESS FOR FABRICATING A SEMICONDUCTOR DEVICE HAVING AN INSULATING LAYER FORMED OVER A SEMICONDUCTOR SUBSTRATE

CROSS-REFERENCE TO RELATED APPLICATION

This application is a divisional of application Ser. No. 10/306,565 filed Nov. 27, 2002, now abandoned. The above-listed application Ser. No. 10/306,565 is commonly assigned with the present invention and is incorporated herein by reference.

TECHNICAL FIELD OF THE INVENTION

The present invention is directed, in general, to semiconductor devices and is more specifically directed to a method for forming an insulating layer over a semiconductor substrate that includes forming a seed layer for a dielectric layer.

BACKGROUND OF THE INVENTION

As active device dimensions get smaller, it is desirable to reduce the thickness of a gate insulating layer in such devices. The push toward thinner insulating layers is expected to limit the use of the currently popular conventional gate insulting layer, silicon dioxide. This follows because at some point of diminishing thickness, about 1 to about 1.2 nm, the leakage of current through the silicon dioxide insulating layer will become unacceptably high and adversely affect device performance.

One proposed solution is to use gate insulating layers composed of dielectric materials with a higher dielectric constant than that of silicon dioxide. Such materials, termed high K dielectrics, have superior insulating characteristics compared to silicon dioxide for equivalent thicknesses, for example, by allowing less leakage current. There are, however, a number of problems with forming gate insulating layers composed of dielectric materials. It is difficult, for example, to deposit high K dielectric materials by chemical vapor deposition directly on hydrogen-terminated silicon substrates, because such materials are not reactive enough to bond directly to silicon.

To facilitate deposition, typically an underlying layer of silicon hydroxide or oxide is first formed between the silicon substrate and the high K dielectric material. Formation of a silicon dioxide layer of about 1 nm or thicker, defeats the purpose of switching to a high K dielectric, because the presence of the thick silicon dioxide layer again gives rise to the above-mentioned problems. Alternatively, the formation of a silicon dioxide layer between the substrate and the dielectric layer may be an unavoidable by-product of the conventional techniques used to deposit the dielectric material and underlying layer on the silicon substrate. Techniques, such as metal-organic, chemical vapor deposition (CVD), rapid thermal CVD, atomic layer CVD, sputtering and electron-beam evaporation, all result in the formation of an undesired silicon dioxide layer.

One approach, for example, is using atomic layer deposition (ALD) to expose a hydrogen-terminated silicon surface to an oxygen source, such as water, to form an oxide layer, followed by the deposition of a high K dielectric precursor. Brief alternating exposures of the substrate to the oxygen source and the high K dielectric precursor result in the formation of a metal oxide layer comprising the high K dielectric. The high K dielectric layer, however, also contains an unacceptably thick (about 1 nm) silicon dioxide layer, and semiconductor devices having such insulating layers will not achieve an equivalent oxide thickness of less than 1 nm, as is desired for CMOS scaling.

Accordingly, what is needed in the art is a semiconductor device and method of manufacturing thereof that does not exhibit the limitations of the prior art.

SUMMARY OF THE INVENTION

To address the above-discussed deficiencies of the prior art, the present invention provides in one embodiment, a method of manufacturing a semiconductor device. The method includes forming a hydrogen-terminated surface on a silicon substrate and forming an insulating layer over the silicon substrate. Forming the insulating layer includes exposing the hydrogen-terminated surface in a substantially oxygen-free environment to a seed layer precursor comprising a methylated metal to form a seed layer. Forming the insulating layer further includes depositing a dielectric material on the seed layer to form the insulating layer.

Still another embodiment is directed to an active semiconductor device comprising a semiconductor substrate, an insulating layer on the semiconductor substrate, a gate electrode located over the insulating layer, and doped regions located in the semiconductor substrate. The insulating layer comprises a seed layer and a dielectric material on the seed layer. The seed layer comprises substantially a monolayer of a metal oxide having a thickness of up to about 2 Angstroms. A metal of the metal oxide is attached to the semiconductor substrate.

The foregoing has outlined preferred features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
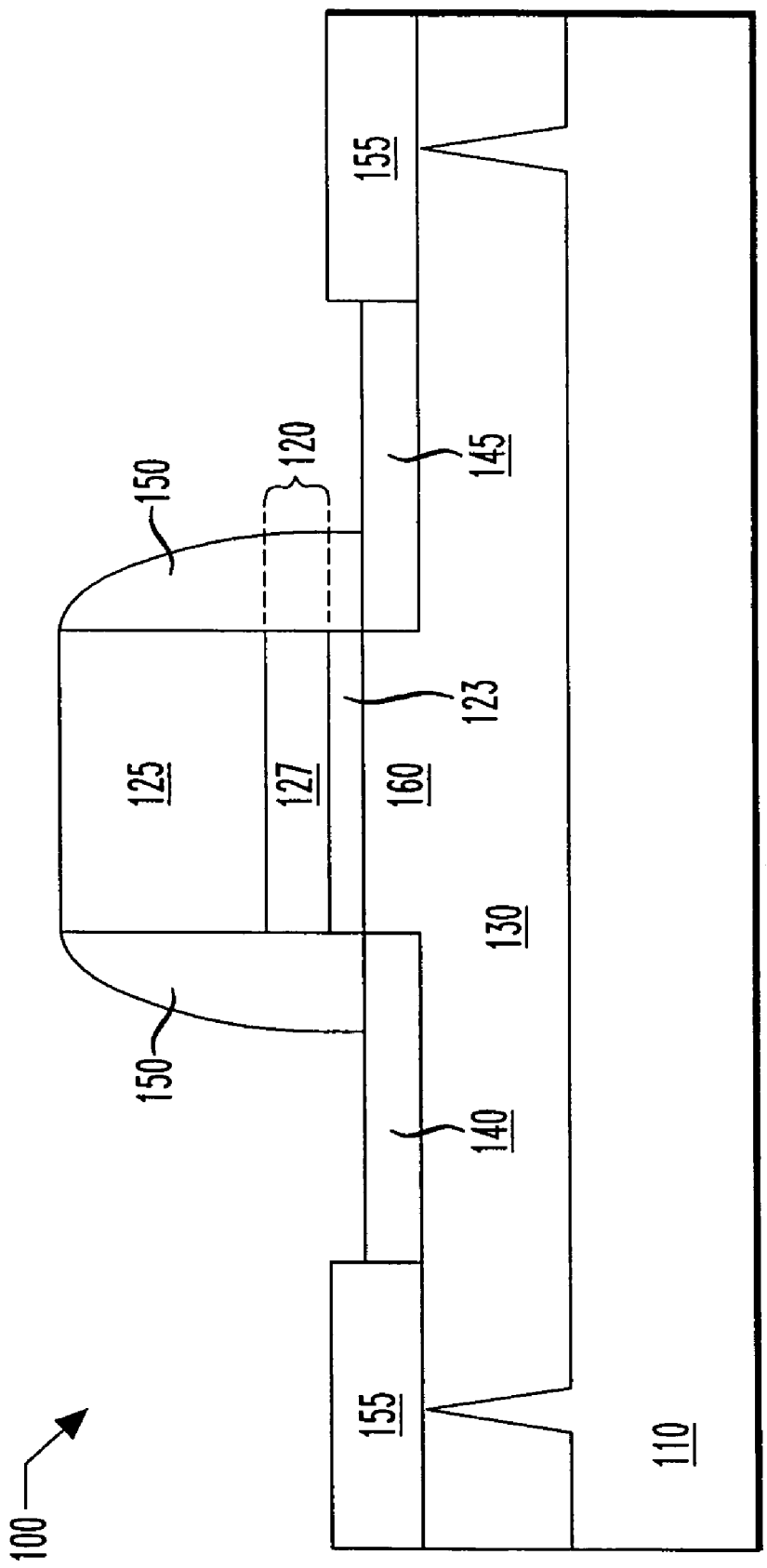
FIG. 1 illustrates a sectional view of an exemplary active device of the present invention.

Embodiments of the present invention benefit from the recognition of a new method to form an insulating layer over a silicon substrate. It was discovered that the deposition of insulating layers comprising a dielectric material is facilitated by the deposition of a seed layer precursor comprising a methylated-metal compound. Sufficiently long exposures of the hydrogen-terminated silicon substrate to the seed layer precursor results in the formation of a uniform seed layer substantially comprising a monolayer of a metal oxide where the metal of the metal oxide is directly attached to surface silicon atoms of the substrate.

The uniform seed layer acts as a template to facilitate the deposition of an insulating layer comprising a uniform high K dielectric on the seed layer that is substantially silicon dioxide free. By retarding the undesirable oxidation of the silicon surface, the seed layer further helps improve the performance of active devices that include the insulating layer. For example, the silicon dioxide (e.g., Si—O—Si bonds) content in insulating layers prepared according to the present invention is less than about 0.1 nm on average. Moreover, the prevalent configuration is not Si—O—Si bonds, but Si—O—Al bonds that are distinct from a silicon dioxide configuration and constitute at most one monolayer.

Certain embodiments of the present invention further benefit from the realization that previous approaches using ALD are based on the erroneous concept that it is necessary to form a hydroxide or oxide seed layer on the silicon substrate prior to depositing the high K dielectric.

Previous approaches have incorrectly assumed that exposing the hydrogen-terminated silicon surface to an oxygen source, such as water, using ALD for example, resulted in the formation of a hydroxide or oxide on the silicon substrate. Without the benefit of the present invention, conventional thinking is that a silicon hydroxide or oxide layer is necessary to act as a seed layer to allow the formation of silicon-oxygen-metal bonds with the high K dielectric. ALD techniques, for example, typically first briefly expose the silicon substrate surface to water, and then briefly expose the resulting surface to a precursor for the dielectric material. The conventional belief is that exposure to water results in the formation of a silicon hydroxide layer that is necessary to facilitate the attachment of the dielectric to the substrate. After attempting to form the silicon hydroxide layer, conventional ALD techniques then apply brief alternating sequential exposures, measured in units of Langmuirs, of a metal precursor (e.g., to an upper limit of about $1 \times 10^4$ Langmuirs) which combine with an oxygen source to deposit an insulating layer. Brief exposures of the substrate to the precursor for the dielectric material are used because of the conventional belief that brief exposures are sufficient to ensure substantial saturation of the surface reaction attaching the precursor molecules to the substrate and attachment of the precursor molecules to substantially all available substrate surface sites.

In contrast, certain embodiments of the present invention benefit from the discovery that such conventional procedures result in the undesirable formation of a thick silicon dioxide layer between the silicon substrate and the dielectric material. As further illustrated in the experimental section to follow, for instance, the formation of a hydroxide layer is retarded when a hydrogen-terminated silicon surface is exposed to the oxygen source. Moreover, brief exposures to the precursor to the dielectric material do not result in substantially complete coverage of the silicon substrate with the dielectric. Such prior art methods result in incomplete coverage of the silicon substrate with the dielectric, which in turn, allows the growth of undesirably thick, greater than about 0.3 nm, layer of silicon dioxide on the silicon substrate.

One embodiment of the invention, illustrated in FIG. 1, is a sectional view of a device manufactured according the principles of the present invention. The method includes forming a hydrogen-terminated surface on a silicon substrate and forming an insulating layer over the silicon substrate. Forming the insulating layer includes exposing the hydrogen-terminated surface in a substantially-oxygen-free environment to a seed layer precursor comprising a methylated metal to form a seed layer. Forming the insulating layer further includes depositing a dielectric material on the seed layer to form the insulating layer.

In certain embodiments, the silicon substrate is preferably substantially devoid of surface contamination and is hydrogen-passivated using conventional techniques well known to those skilled in the art. Hydrogen passivation may include, for example, chemically growing an oxide on the silicon surface, followed by etching in dilute hydrofluoric acid. Preferably, the hydrogen-terminated surface has greater than about 80 percent, and more preferably greater than about 95 percent of its surface atoms bonded to hydrogen.

The term substantially oxygen-free environment as used herein refers to less than about $1 \times 10^{-6}$ Torr oxygen present in the environment, such as a chemical vapor deposition chamber, where the silicon substrate is exposed to the seed layer precursor. In certain embodiments, an oxygen-free environment is desirable because this avoids gas phase nucleation reactions between the methylated metal of the seed layer precursor and oxygen.

In an advantageous embodiment, the seed layer precursor is a methylated-metal compound having at least one carbon-metal bond. In certain embodiments, it is desirable for the seed layer precursor to be volatile at room temperatures or higher. The seed layer precursor is preferably reactive enough to replace silicon-hydrogen bonds of the hydrogen-terminated surface on the silicon substrate with metal-silicon bonds, or with metal-oxygen-silicon bonds, at temperatures of 400° C. or lower, as further discussed below.

In preferred embodiments, the seed layer precursor is a precursor for a high K dielectric. One example of the high K dielectric may be a material having a dielectric constant higher than the dielectric constant of silicon dioxide. Preferably, the dielectric constant of the high K dielectric relative to that of air is at least about 7. The dielectric constant refers to the multiplicative factor of the dielectric constant of the material of interest, as compared to the dielectric constant of air (about $8.85 \times 10^{-14}$ Farad/cm)

Exemplary seed layer precursors having suitable reactivities and metal-silicon bond strengths include compounds such as $Al(CH_3)_3$; $Hf(CH_3)_4$; $Zr(CH_3)_4$; $Y(CH_3)_3$; $La(CH_3)_3$; and combinations thereof. It is particularly desirable for the seed layer precursor to be trimethylaluminum $Al(CH_3)_3$. In addition, any of the metals of the precursors may be partially oxygenated, so long as at least one carbon-metal bond, corresponding to the metal-methyl bond, remains. Nonexclusive examples include: $Al(OH)_2(CH_3)$; $Al(OH)(CH_3)_2$; $Hf(OH)_3(CH_3)$ or $Hf(OH)_2(CH_3)_2$. Other examples of mono, di- or tri- hydroxylated methylated metals would be evident to one skilled in the art.

Any conventional technique may be used to expose the silicon substrate to the seed layer precursor while in an oxygen-free environment, to form the seed layer. Preferably the seed layer is formed using chemical vapor deposition. More preferably, the silicon substrate is exposed to the seed layer precursor using atomic layer deposition or analogous methods like nano-layer deposition, or pulse-layer deposition.

The deposition of a substantially uniform monolayer seed layer is facilitated by exposing the hydrogen-terminated surface of the silicon substrate to sufficient quantities of the seed layer precursor. Sufficient exposure may be achieved by adjusting either the time of exposure or the pressure of the seed layer precursor vapor, as represented by Langmuirs of exposure. For the purposes of the present invention, one Langmuir unit is defined as exposure to a quantity of a compound, such as a seed layer precursor, corresponding to $10^{-6}$ Torr for one second. In certain preferred embodiments, for example exposure to the seed layer precursor is greater than about $5 \times 10^4$ Langmuirs, and more preferably between about $1 \times 10^6$ Langmuirs and $6 \times 10^7$ Langmuirs.

One advantageous feature of the present invention is the formation of a uniform monolayer comprising the seed layer over the surface of the silicon substrate. A monolayer refers to the surface density of the substrate, which is the number of metal atoms of the seed layer precursor associated with the surface silicon atoms of the silicon substrate to form the seed layer. A (100) silicon surface, for instance, has a surface density of about $6.8 \times 10^{14}$ silicon atoms per cm². Other types of silicon surfaces have similar surface densities.

The use of a precursor comprising a methylated metal facilitates the deposition of a monolayer because the methyl groups that remain attached to the metal may discourage deposition of more than one layer of the seed layer material on the substrate at the growth conditions. If, for example, the seed layer precursor is $Al(CH_3)_3$, then the number of aluminum atoms bonded to silicon on a (100) silicon surface can equal about $5.1 \times 10^{14}$ aluminum atoms per cm². In preferred embodiments, the seed layer is between one-third (⅓) and about one monolayer, and more preferably about three-quarters (¾) monolayer. One monolayer of seed layer or less has a thickness of between about one Angstrom and about two Angstroms.

Forming the seed layer further includes exposing the seed layer precursor, after attachment to the silicon substrate, to an oxygen source. For example, when the seed layer precursor, such as Al(CH3)3, attaches to the silicon substrate, a silicon-aluminum bond, or silicon-oxygen-aluminum bond, forms on the silicon surface, with the aluminum atom still bonded to two methyl groups, and methane is released as a by-product. In certain embodiments, where exposure to the silicon substrate to the seed layer occurs at temperatures below about 100° C., the seed layer precursor is physisorbed on the hydrogen-terminated silicon substrate. Subsequent exposure to an oxygen source, such as oxygen or ozone and more preferably water, results in the binding of oxygen atoms to aluminum to form an aluminum hydroxide, with the release of the remaining two methyl groups bonded to aluminum as methane by-products. In addition, oxygen will be inserted between silicon and aluminum atoms which have not already formed silicon-oxygen-aluminum bonding structures to form additional silicon-oxygen-aluminum bonded structures at the silicon substrate surface.

In certain embodiments, where it is desirable to reduce hot carrier degradation, the oxygen source is preferably deuterated water (e.g., HDO and $D_2O$). Charge or hot carrier degradation is the undesirable effect of charge carriers or hot carriers, such as electrons or holes, in a channel. The charge carriers have sufficient energy (e.g., greater than about 2 eV) to remove passivating light atoms, such as hydrogen. Deuterium, by virtue of its higher mass compared to hydrogen, resists removal by the charge carriers.

In preferred embodiments it is desirable to form the insulating layer at low temperatures, such as below about 400° C., so as not to detrimentally affect other components formed in the semiconductor device. Low temperatures may also minimize diffusion of the seed layer or its component atoms into the silicon substrate. In preferred embodiments, for example, exposure to the seed layer precursor occurs at between about 400° C. and about 20° C., and more preferably between about 400° C. and about 250° C. In particular embodiments where the seed layer precursor was physisorbed on the on the hydrogen-terminated silicon substrate and exposed to an oxygen source, however, it is desirable to treat the resulting surface to temperatures above about 100° C. to facilitate the formation of silicon-oxygen-aluminum bonds.

The formation of a uniform monolayer of the seed layer facilitates depositing the dielectric material on the seed layer. In certain embodiments, the seed layer forms a template for depositing a dielectric material that serves as a gate dielectric on the seed layer. The dielectric material may comprise silica, although more preferably, dielectric material comprising a high K dielectric. It is advantageous for the high K dielectric material to comprise an element from the periodic table whose oxides are thermodynamically stable on the seed layer and underlying silicon substrate, as discussed in Wilk et al., Journal of Applied Physics, vol. 89, p. 5243 (2001), incorporated by reference herein. The high K dielectric may be deposited by conventional techniques, well known to those skilled in the art, such as, physical chemical deposition, or more preferably chemical vapor deposition, such as organometallic chemical vapor deposition and more preferably, atomic layer deposition.

Non limiting examples of suitable high K dielectric materials are metal oxide compounds consisting of: aluminum oxide; zirconium oxide; hafnium oxide; titanium oxide; tantalum oxide; yttrium oxide; lanthanum oxide; and combinations thereof. Moreover, any of these materials may be combined with silicon dioxide to form metal silicates.

Particularly preferred high K dielectric materials are aluminum oxides, such as $Al_2O_3$, zirconium oxides, such as $ZrO_2$, and hafnium oxides, such as $HfO_2$. Hafnium dioxide is preferred because it has a very high dielectric constant (e.g., about 25) and therefore can give rise to an insulating layer with a very low leakage current. Desirable combinations of high K dielectric materials include combinations of aluminum and hafnium oxides. Aluminum and hafnium combined with each other or other high K dielectric materials are advantageous, because they tend to form amorphous structures that are more conducive to minimizing leakage currents. Moreover, one or more of the high K dielectric materials may be combined with silicon oxides, to, for example produce a composite material with a dielectric constant between the dielectric constant of silicon oxide and the dielectric constant of the high K dielectric material.

FIG. 1 illustrates an exemplary embodiment of another aspect of the present invention, an active semiconductor device 100. The device 100 comprises a semiconductor substrate 110, an insulating layer 120, which includes a seed layer 123, and a dielectric material 127, fabricated as described above in or on the semiconductor substrate 110. A conventional gate 125 is located over the insulating layer 120. The illustrated exemplary device further includes a conventional doped region 130 located in or on the semiconductor substrate 110.

The seed layer 123 comprises substantially a monolayer of a metal oxide having a thickness of up to about two Angstroms and wherein a metal of the metal oxide is attached to the semiconductor substrate. Preferably, the metal of the seed layer is directly attached to surface silicon atoms either as metal-silicon or metal-oxygen-silicon bonds. In certain embodiments, for example, greater than about 95 percent of the metal of the seed layer is attached to the surface silicon atoms as metal-oxygen-silicon bonds, with the remainder corresponding to metal-silicon bonds. Such insulating layers are in contrast to insulating layers in prior art semiconductor devices fabricated using traditional methods that would also include a silicon dioxide layer between the semiconductor substrate and the dielectric layer.

Any of the embodiments of the invention discussed herein, such as the composition and thickness of the seed layer 123 or the composition of the dielectric material 127 comprising the insulating layer 120, may be included in the device 100. In certain preferred embodiments the device 100 is a MOSFET. The doped region, preferably includes conventional source and drain regions 140, 145, respectively, located in or on the semiconductor substrate 110, on either side of the gate 125. Conventional spacers 150 are located adjacent to the gate 125. In other embodiments, however, the doped region 130 may be a single doped region located within a well. The semiconductor substrate 110 is preferably a silicon substrate, although other semiconductor device substrates known to those skilled in the art are also within the scope of the present invention. In such embodiments, the device 100 may further include a conventionally formed channel region 160 between the source and drain 140, 145, spacers 150, and field oxide 155 regions.

The source and drain 140, 145 may be doped with any conventional materials, such as boron, phosphorous or arsenic or may be comprised of silicides of titanium, cobalt, or nickel or combinations thereof. Similarly, any conventional conductive material may be used as the gate 125. Non-limiting examples of gate materials include aluminum, titanium, gold, silver, platinum, refractory metals selected from the group consisting of tungsten, rhenium, tantalum, molybdenum and niobium, a refractory metal silicide of any of the above-mentioned metals, such as $WSi_2$, polysilicon, polysilicongermanium, polycide and combinations thereof.

Figure 2A:
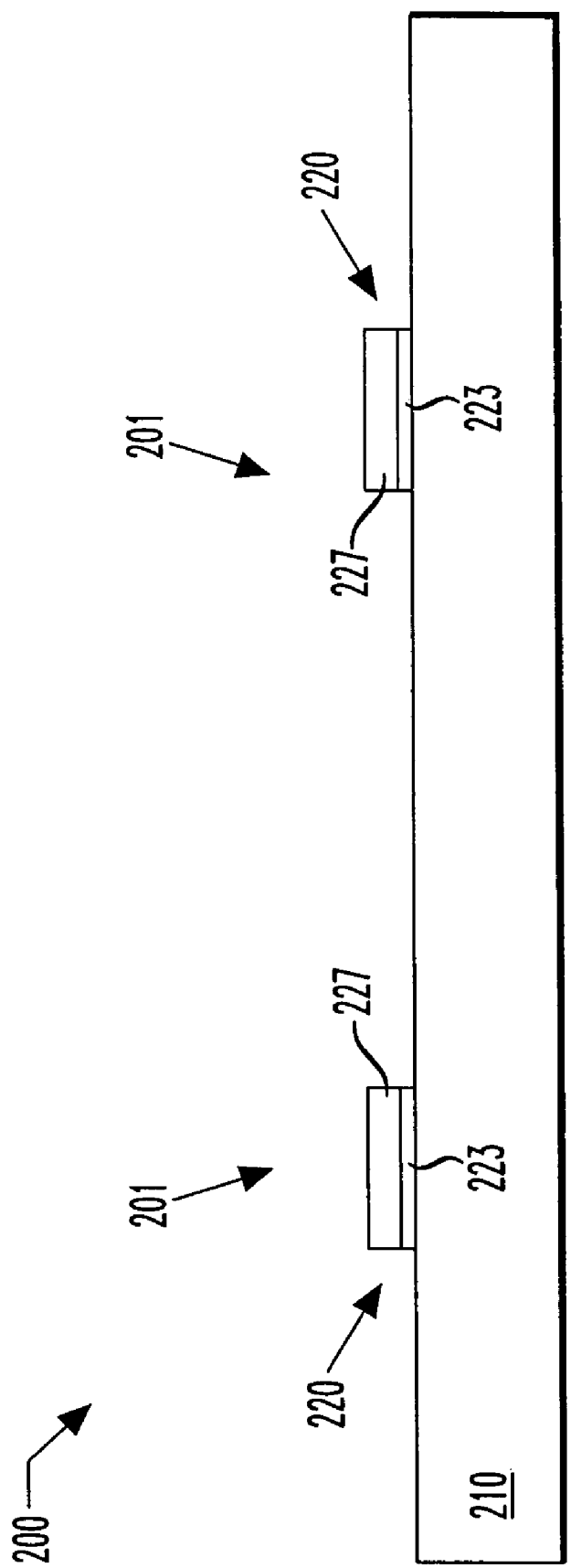
FIG. 2 illustrates sectional views of a device formed by a method of fabricating an integrated circuit, according to the principles of the present invention.
Figure 2B:
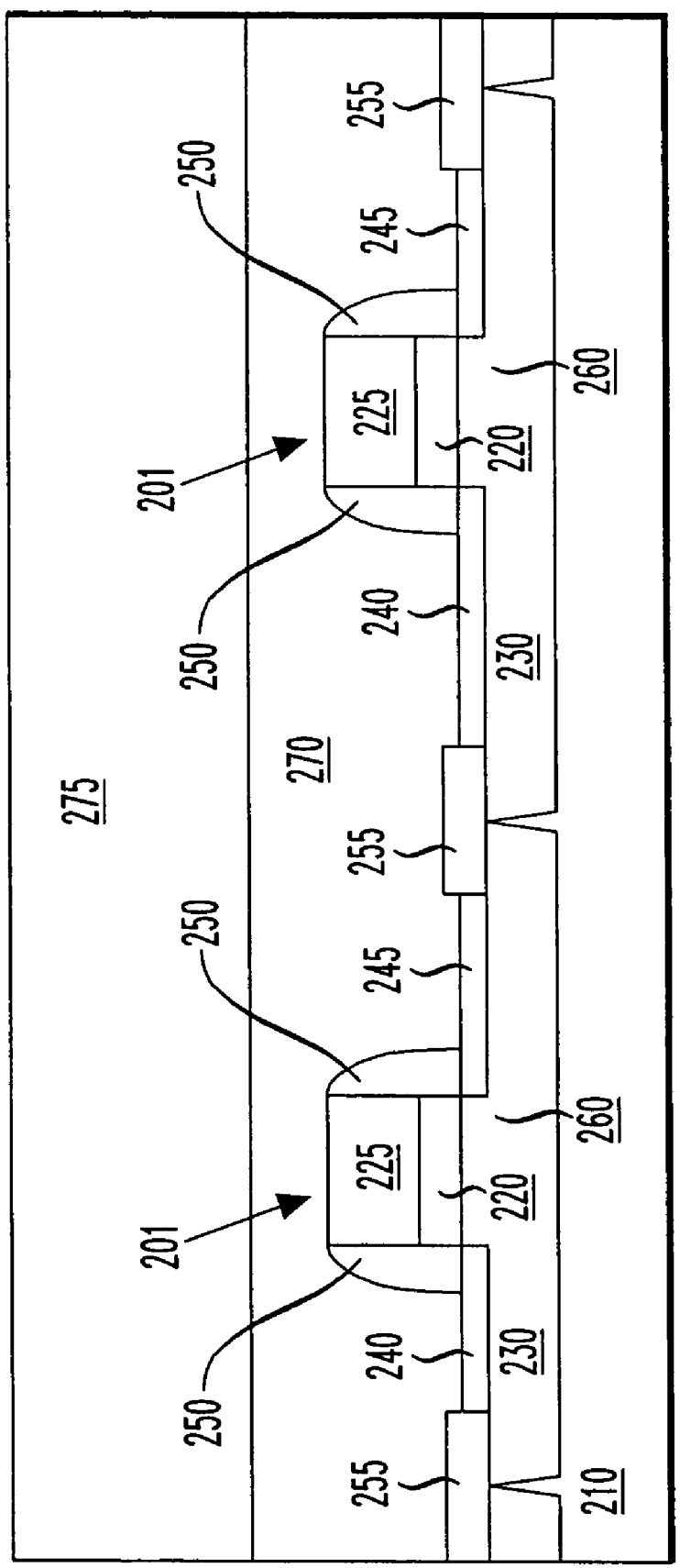
Figure 2C:
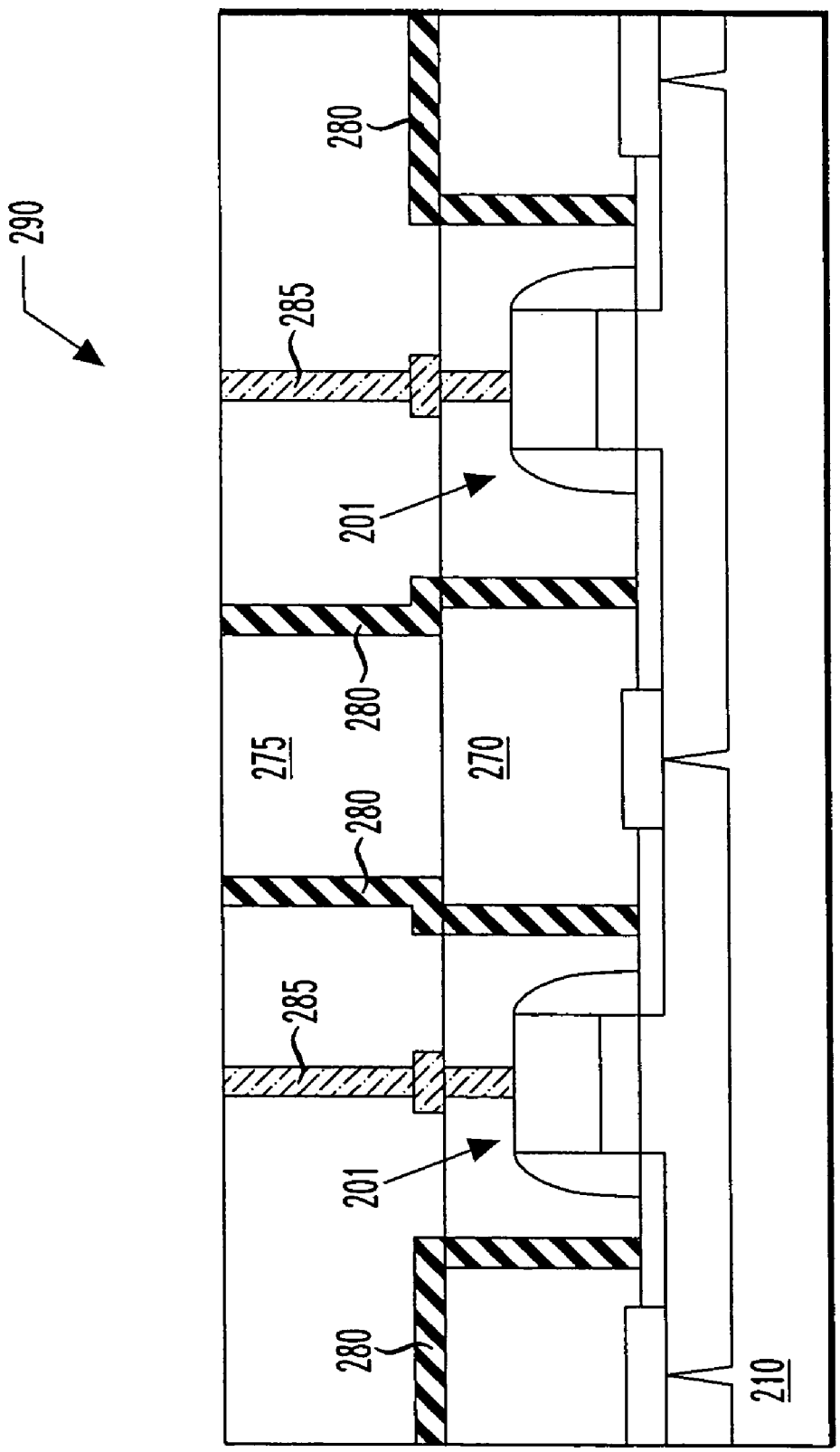

FIGS. 2A to 2C illustrate selected stages of yet another aspect of the present invention, a method of fabricating an integrated circuit 200. FIG. 2A, illustrates forming active devices 201, over and in a semiconductor substrate 210, including forming an insulating layer 220, as provided by an embodiment of the present invention, on the semiconductor substrate 210. Forming the insulating layer 220 includes forming a seed layer 223, and forming a dielectric material 227 over the seed layer 223, as discussed above.

Forming the active device 210 further includes conventionally forming a gate electrode 225 over the insulating layer 220 and forming doped regions 230 in or on the semiconductor substrate 210 (FIG. 2B), which may include source and drain regions 240, 245. Forming the device 210 may also include forming conventional spacer 250 and field oxide 255 regions, as well as channel regions 260. Additional insulating layers 270, 275 may be deposited over the active devices 201 using conventional techniques. As illustrated in FIG. 2C, the method further includes conventionally interconnecting the active devices 201 with interconnect structures 280, 285 to form an operative integrated circuit 290.

Having described the present invention, it is believed that the same will become even more apparent by reference to the following examples. It will be appreciated that the examples are presented solely for the purpose of illustration and should not be construed as limiting the invention. For example, although the experiments described below may be carried out in laboratory setting, one of ordinary skill in the art could adjust specific numbers, dimensions and quantities up to appropriate values for a full scale plant.

EXPERIMENTS

Figure 3:
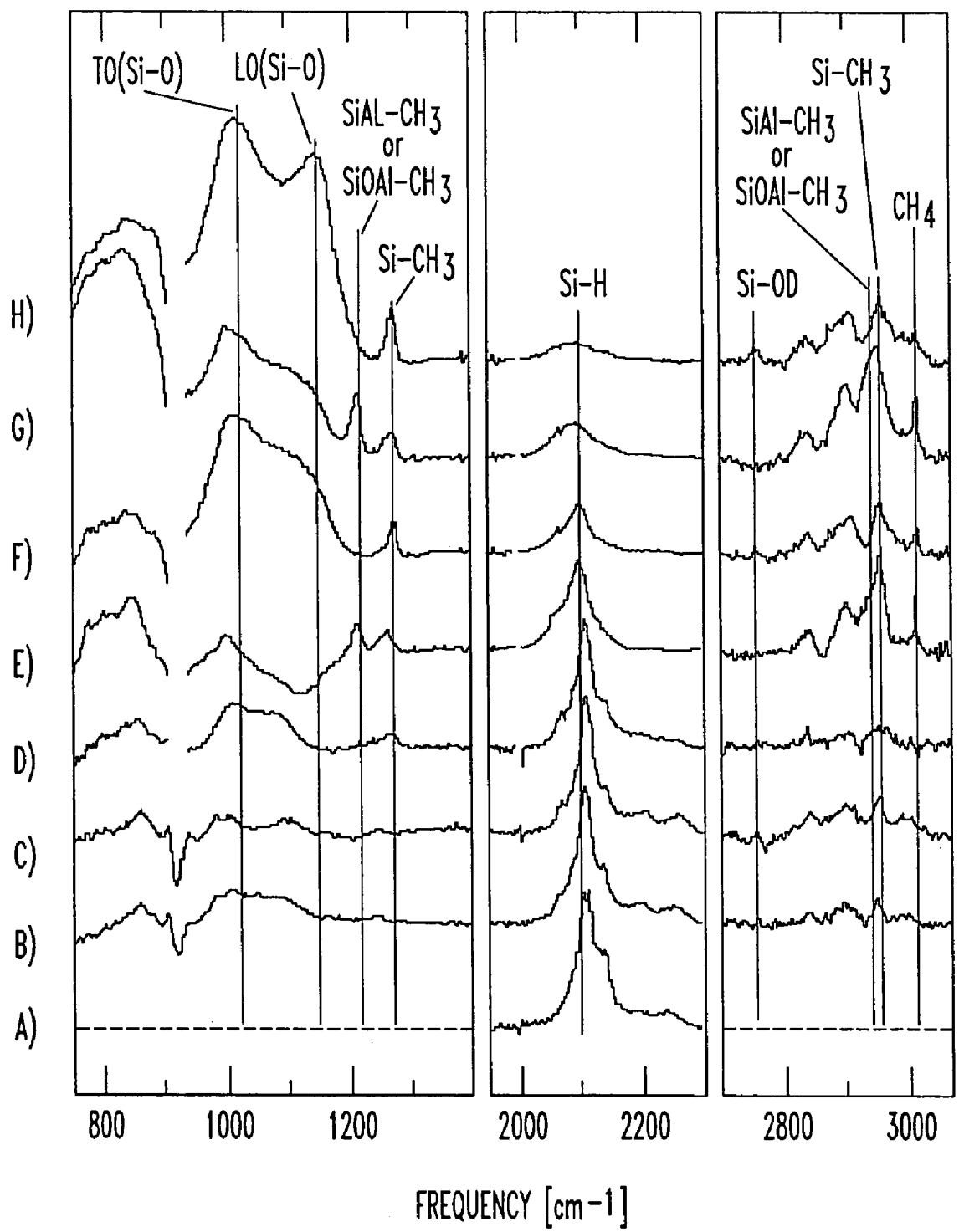
FIG. 3 illustrates exemplary infrared absorption spectra of a seed layer surface fabricated according to the principles of the present invention.

A silicon substrate was passivated to form a hydrogen-terminated surface and exemplary seed layers were formed on the surface according to the principles of the present invention as well as according to conventional techniques. All experiments were performed using a conventional ALD tool, or a model reactor which emulates the commercial ALD process. The silicon surfaces were examined using Infrared Absorption Spectroscopy (IRAS), as illustrated by the exemplary spectra shown in FIG. 3.

Spectrum A shows an exemplary spectrum of a hydrogen-terminated silicon surface after passivation. Passivation was achieved by a hydrofluoric wet etch and subsequent water rinse of an oxidized silicon(100) surface. Spectrum (A) is depicted as a series of dotted lines from 800–1400 and 2700 to 3100 $cm^{-1}$ because there was no appropriate spectral reference for these regions. No relevant absorption signals are present in these regains, as verified by using a different reference surface. An absorption band ("peak") corresponding to Si—H bonds is visible at ~2100 $cm^{-1}$. Spectrum B was obtained after treating the silicon substrate with the hydrogen-terminated surface shown in spectrum A at a temperature of ~300° C. for about 1 minute. The similarity between spectra A and B indicates that there is no surface contamination of the hydrogen-terminated surface with organic compounds that could give rise to a peak corresponding to a Si—$CH_3$ bond at ~1260 or ~2940 $cm^{-1}$.

Spectrum C was obtained after exposing the hydrogen-terminated silicon surface shown in spectrum B to $10^9$ Langmuirs of $D_2O$ at ~300° C. For study purposes, $D_2O$ was used instead of $H_2O$ to allow positive identification of all OD stretch modes, such as the one at ~2760 $cm^{-1}$. In comparison, OH stretch modes can be hidden or interfered with by the background water vapor in the spectrometer purge or adsorbed OH on the spectrometer optics. Spectrum C shows a very small peak from Si—OD corresponding to less than about 0.02 of a monolayer on the silicon surface. This demonstrates the error in conventional thinking that a water pulse is necessary to create a hydroxylated silicon surface to serve as a seed layer for depositing dielectric material. In fact, a water pulse applied at such temperatures does very little to the hydrogen terminated silicon surface, as evidenced by the lack of any noticeable change in the Si-H band centered at 2100 $cm^{-1}$.

Spectrum D was obtained after exposing the hydrogen-terminated silicon surface shown in spectrum A or B, to a brief pulse of trimethylaluminum (TMA) corresponding to about $5\times10^5$ Langmuirs at about 300° C. Although this is a relatively brief pulse for the ALD tool used in the present experiments, conventional techniques for forming gate insulating layers in semiconductor device typically use a TMA pulse on the order of $10^2$ to $10^3$ times shorter than used in the present experiments. Nevertheless, spectrum D shows neither SiOAl—$CH_3$ nor SiAl—$CH_3$ bond formation that would give rise to a peak at ~1215 $cm^{-1}$ or ~2940 $cm^{-1}$.

Thus in contrast to conventional thinking, brief pulses of TMA are inadequate at attaching desirable amounts (e.g., more than one-half of a monolayer) of aluminum to the surface.

Spectrum E was obtained after exposing the hydrogen-terminated silicon surface shown in spectrum A or B, to a long pulse of trimethylaluminum (TMA) corresponding to about $1\times10^8$ Langmuirs at about 300° C. Spectrum E demonstrates that long pulses of TMA with no intervening water pulse, such as that used in the present invention, give rise to substantial amounts (e.g., more than one-half of a monolayer) of SiOAl—$CH_3$ or SiAl—$CH_3$ bonds giving rise to a peak at ~1215 cm−1. In addition, very little silicon dioxide is deposited on the silicon substrate, as indicated by the small peaks corresponding to TO and LO Si—O. The abbreviations LO and TO in FIG. 3 denote longitudinal-optical and transverse-optical phonon modes of the silicon oxide, respectively. The TO and LO Si—O peaks in spectrum E, however, likely correspond to Si—O—Al bonds and not Si—O bonds of silicon dioxide.

The series of spectra F through H demonstrate the formation of an insulating layer comprising aluminum oxide. Spectrum F was obtained after exposing the TMA treated silicon surface shown in spectrum E, to a pulse of $D_2O$ corresponding to about $10^9$ Langmuirs at about 300° C. After the $D_2O$ pulse the peak corresponding to SiOAl—$CH_3$ or SiAl—$CH_3$ decreases, signifying the replacement of methyl groups bonded to aluminum, with hydroxyl groups bonded to aluminum. Spectrum G was obtained after exposing the surface treated with $D_2O$ shown in spectrum F, to another long pulse of TMA, where the peak corresponding to SiOAl—$CH_3$, SiAl—$CH_3$ or AlOAl—$CH_3$ reappears. Spectrum H was obtained after exposing the surface treated with TMA shown in spectrum G, to another pulse of $D_2O$, where the peak corresponding to SiOAl—$CH_3$ or SiAl—$CH_3$ disappears. For study purposes, large pulses of $D_2O$ were used in the steps represented by spectra F and H and consequently, larger amounts of silicon oxide (peaks labeled LO(Si) and TO(Si)) were formed than would be formed in a process to formed an active semiconductor device. The silicon dioxide layer in the structures corresponding to spectra F and H had a thickness of about 0.12 nm and about 0.2 nm, respectively.

Figure 4:
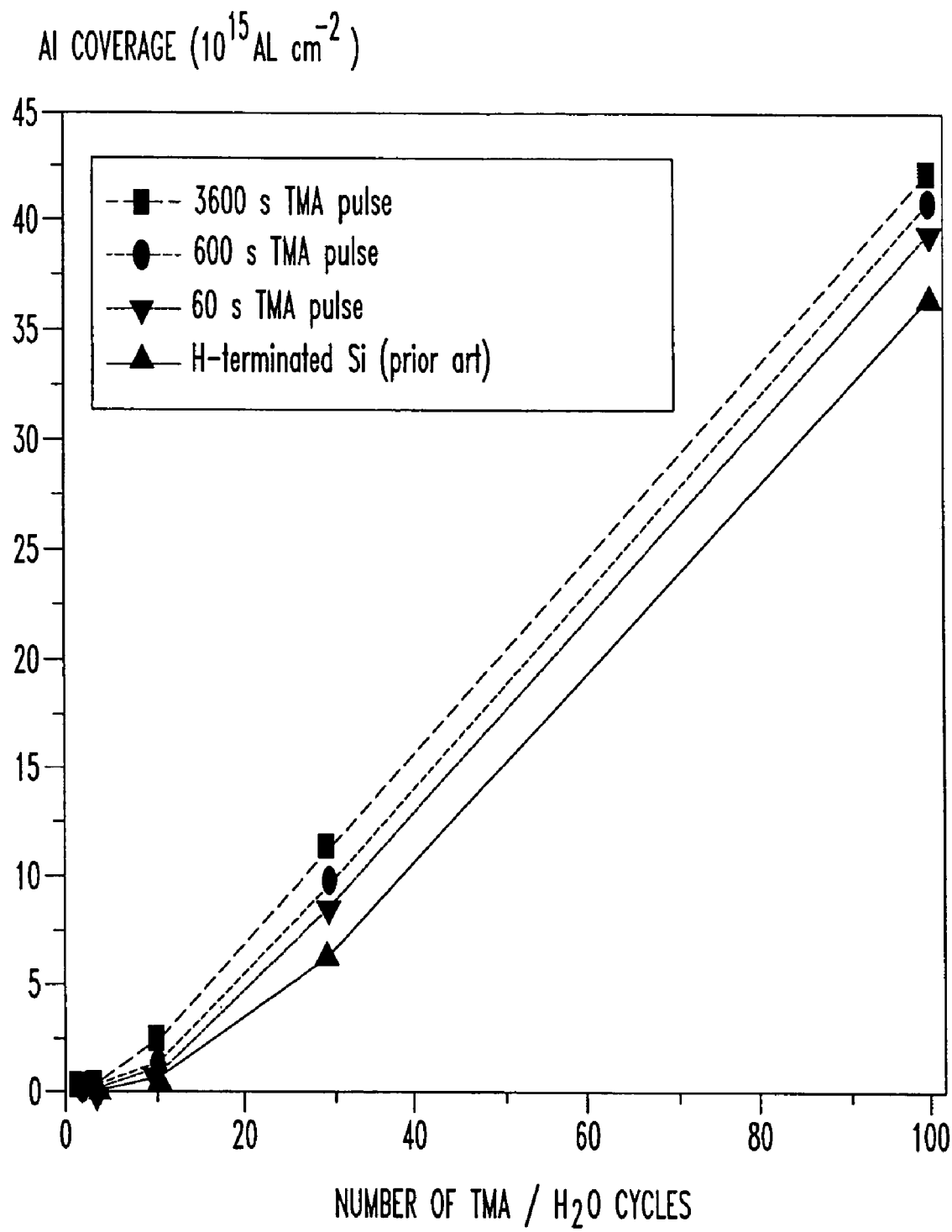
FIG. 4 illustrates the relationship between the atomic density of aluminum in an aluminum oxide layer grown on a silicon substrate and different durations of first exposures to trimethylaluminum followed by repetitive alternating pulses of water pulses and trimethylaluminum.

FIG. 4 Illustrates the dependence of the total aluminum coverage of a silicon substrate as a function of the number of TMA and water pulse cycles for different silicon surfaces. Aluminum coverage was measured using conventional nuclear reaction analysis. The silicon surface designated H-terminated was exposed to alternating TMA and water pulses with no pretreatment of the hydrogen terminated silicon substrate, as done using conventional methods. The silicon surfaces designated as 60 s, 600 s and 3600 s were initially treated with TMA for periods of either 60 s, 600 s or 3600 s, respectively, to form a seed layer according to the present invention. FIG. 4 illustrates that, for a given number of TMA and water pulse cycles, silicon substrates that are pretreated with long pulses of TMA to form a seed layer thereon, have greater levels of aluminum coverage as compared to a hydrogen-terminated with no seed layer.

Although the present invention has been described in detail, one of ordinary skill in the art should understand that they can make various changes, substitutions and alterations herein without departing from the scope of the invention.

What is claimed is:

1. A method of manufacturing a semiconductor device, comprising:
   forming a hydrogen-terminated surface on a silicon substrate; and
   forming an insulating layer over said silicon substrate, including:
     exposing said substantially hydrogen-terminated surface in a substantially oxygen-free environment to a seed layer precursor comprising a methylated metal to form a seed layer; and
     depositing a dielectric material on said seed layer to form said insulating layer.

2. The method as recited in claim 1, wherein said seed layer precursor is selected from the group consisting of:
   $Al(CH_3)_3$;
   $Al(OH)_2(CH_3)$;
   $Hf(CH_3)_4$;
   $Hf(OH)_3(CH_3)$;
   $Zr(CH_3)_4$;
   $Y(CH_3)_3$
   $La(CH_3)_3$; and
   combinations thereof.

3. The method as recited in claim 1, wherein said seed layer precursor is $Al(CH_3)_3$.

4. The method as recited in claim 1, wherein said seed layer is formed by chemical vapor deposition.

5. The method as recited in claim 4, wherein said seed layer is formed by atomic layer deposition.

6. The method as recited in claim 1, wherein exposure to said seed layer precursor is greater than about $5\times10^4$ Langmuirs.

7. The method as recited in claim 1, wherein exposure to said seed layer precursor is between about $1\times10^6$ Langinuirs and $6\times10^7$ Langmuirs.

8. The method as recited in claim 1, wherein said seed layer has a thickness of about two Angstroms or less.

9. The method as recited in claim 1, wherein said seed layer has a thickness between about one-third and about one monolayer.

10. The method as recited in claim 1, wherein forming said seed layer precursor occurs at between about 400° C. and about 200° C.

11. The method as recited in claim 1, wherein forming said seed layer precursor occurs at between about 400° C. and about 250° C.

12. The method as recited in claim 1, wherein said seed layer forms a template for a gate dielectric.

13. The method as recited in claim 1, wherein said gate dielectric comprises said dielectric material on said seed layer.

14. The meted as recited in claim 1, wherein exposure to said seed layer precursor is about $1\times10^8$ Langinuirs.

15. The method as recited in claim 1, wherein exposure to said seed layer precursor is for a single period of at least about 60 seconds.

16. The method as recited in claim 1, wherein exposure to said seed layer precursor is for a single period of at least about 600 seconds.

17. The meted as recited in claim 1, wherein said hydrogen-terminated surface exposed to said seed layer precursor has less than about 0.02 of a monolayer of hydroxylated silicon surface.

* * * * *